United States Patent
Choi et al.

(10) Patent No.: US 8,452,025 B2
(45) Date of Patent: May 28, 2013

(54) POWER SUPPLY CIRCUIT INCLUDING VOLTAGE REGULATOR AND HEADPHONE DRIVING CIRCUIT EMPLOYING THE SAME

(75) Inventors: Yeongha Choi, Anyang-si (KR); Jin Ho Oh, Yongin-si (KR); Min Soo Kim, Gwangmyeong-si (KR); Jae-Hee Won, Seoul (KR)

(73) Assignee: Neofidelity, Inc., Seoul (KR)

( * ) Notice: Subject to any disclaimer, the term of this patent is extended or adjusted under 35 U.S.C. 154(b) by 301 days.

(21) Appl. No.: 13/041,781

(22) Filed: Mar. 7, 2011

(65) Prior Publication Data

US 2011/0222702 A1    Sep. 15, 2011

(30) Foreign Application Priority Data

Mar. 9, 2010   (KR) .................. 10-2010-0020804

(51) Int. Cl.
*H04R 1/10*   (2006.01)
*H04B 3/00*   (2006.01)
*H04M 1/00*   (2006.01)

(52) U.S. Cl.
USPC ............... 381/74; 381/77; 381/111; 381/123; 381/370; 381/375; 379/387.01; 379/392.01; 379/395.01; 330/67

(58) Field of Classification Search
USPC .. 381/74, 77, 111, 123, 370, 375; 379/387.01, 379/388.06, 392.01, 395.01; 330/67
See application file for complete search history.

(56) References Cited

U.S. PATENT DOCUMENTS 8,284,953 B2 * 10/2012 Lee et al. ..................... 381/94.5

* cited by examiner

*Primary Examiner* — Vivian Chin
*Assistant Examiner* — Paul Kim
(74) *Attorney, Agent, or Firm* — Stein IP, LLC

(57) ABSTRACT

A power supply circuit including a voltage regulator and a headphone driving circuit employing the same are disclosed. In accordance with the present invention, the power supply circuit may provide stable power supply to the amplifier since the power supply circuit generates the constant voltage +Vreg and the constant voltage −Vreg from +VDD robust to stronger than a power noise, and the balanced signal path for isolating the noise of the input signal to be amplified is not required, thereby simplifying the constitution of the circuit.

14 Claims, 2 Drawing Sheets

POWER SUPPLY CIRCUIT INCLUDING VOLTAGE REGULATOR AND HEADPHONE DRIVING CIRCUIT EMPLOYING THE SAME

This application claims the benefit of Korean Patent Application No. 10-2010-0020804 filed on Mar. 9, 2010, which is hereby incorporated for reference.

BACKGROUND OF THE INVENTION

1. Field of the Invention

The present invention relates to a power supply circuit including a voltage regulator and a headphone driving circuit employing the same, and more particularly to a power supply circuit including a voltage regulator and a headphone driving circuit employing the same comprise the voltage regulator capable of stably providing a positive power supply and a negative power supply to an amplifier included in the headphone driving circuit.

2. Description of the Related Art

A headphone driving circuit comprises an operational amplifier amplifying an audio signal.

When the operational amplifier requiring a positive power supply and a negative power supply is used, the positive power supply is converted to the negative power supply to drive the operational amplifier.

The negative power supply obtained from converting the positive power supply is unstable, and a constitution of a circuit for converting the positive power supply is very complicated.

In addition, since a differential signal should be applied to the operational amplifier, the operational amplifier requires a balanced signal path for isolating a noise form an input signal to be amplified.

SUMMARY OF THE INVENTION

It is an object of the present invention to provide a power supply circuit including a voltage regulator and a headphone driving circuit employing the same comprise the voltage regulator capable of stably providing a positive power supply and a negative power supply to an amplifier included in the headphone driving circuit.

In order to achieve above-described object of the present invention, there is provided a power supply circuit comprising: a reference voltage generator for generating a reference voltage from an output voltage outputted from a voltage source; a voltage regulator for generating a constant voltage +Vreg from the reference voltage; a switch driver for converting an output signal of an oscillator into a first switch driving signal using the constant voltage +Vreg generated by the voltage regulator as a power supply; a level shifter for generating a second switch driving signal from the first switch driving signal generated by the switch driver; and a power switch unit for being driven by the first switch driving signal and the second driving signal to output a first output signal and a second output signal via an anode and a cathode of a first capacitor, respectively, using the constant voltage +Vreg generated by the voltage regulator as a power supply.

Preferably, the first switch driving signal has a voltage of between zero and the constant voltage +Vreg.

Preferably, the second switch driving signal has a voltage of between a constant voltage −Vreg and the constant voltage +Vreg.

Preferably, the first output signal and the second output signal have opposite polarities and each of the first output signal and the second output signal has an absolute value of |Vreg|.

Preferably, the level shifter uses the first output signal and the second output signal as a power supply.

Preferably, the voltage regulator comprises: an operational amplifier having the reference voltage applied to a non-inverting terminal thereof; a first resistor connected between a ground and an inverting terminal of the operational amplifier; a second resistor connected between the first resistor and an output terminal of the voltage regulator; and a transistor connected to an output terminal of the voltage source, an output terminal of the operational amplifier and the second resistor.

There is also provided a headphone driver comprising: a power supply circuit comprising: a reference voltage generator for generating a reference voltage from an output voltage outputted from a voltage source; a voltage regulator for generating a constant voltage +Vreg from the reference voltage; a switch driver for converting an output signal of an oscillator into a first switch driving signal using the constant voltage +Vreg generated by the voltage regulator as a power supply; a level shifter for generating a second switch driving signal from the first switch driving signal generated by the switch driver; and a power switch unit for being driven by the first switch driving signal and the second driving signal to output respectively a first output signal and a second output signal via an anode and a cathode of the first capacitor, respectively, using the constant voltage +Vreg generated by the voltage regulator as a power supply; and an amplifier being provided with a positive power supply and a negative power supply from the voltage regulator and the power switch unit, respectively, to drive a headphone by amplifying an audio signal.

Preferably, the first switch driving signal has a voltage of between zero and the constant voltage +Vreg.

Preferably, the second switch driving signal has a voltage of between a constant voltage −Vreg and the constant voltage +Vreg.

Preferably, the first output signal and the second output signal have opposite polarities and each of the first output signal and the second output signal has an absolute value of |Vreg|.

Preferably, the level shifter uses the first output signal and the second output signal as a power supply.

Preferably, the voltage regulator comprises: an operational amplifier having the reference voltage applied to a non-inverting terminal thereof; a first resistor connected between a ground and an inverting terminal of the operational amplifier; a second resistor connected between the first resistor and an output terminal of the voltage regulator; and a transistor connected to an output terminal of the voltage source, an output terminal of the operational amplifier and the second resistor.

Preferably, the headphone driver further comprises a second capacitor connected between the cathode of the first capacitor and the ground.

Preferably, the headphone driver further comprises an amplifier controller for enabling and disabling the amplifier according to the constant voltage −Vreg.

DETAILED DESCRIPTION OF THE INVENTION

A power supply circuit including a voltage regulator and a headphone driving circuit employing the same in accordance with the present invention will be described in detail with reference to accompanied drawings.

Figure 1:
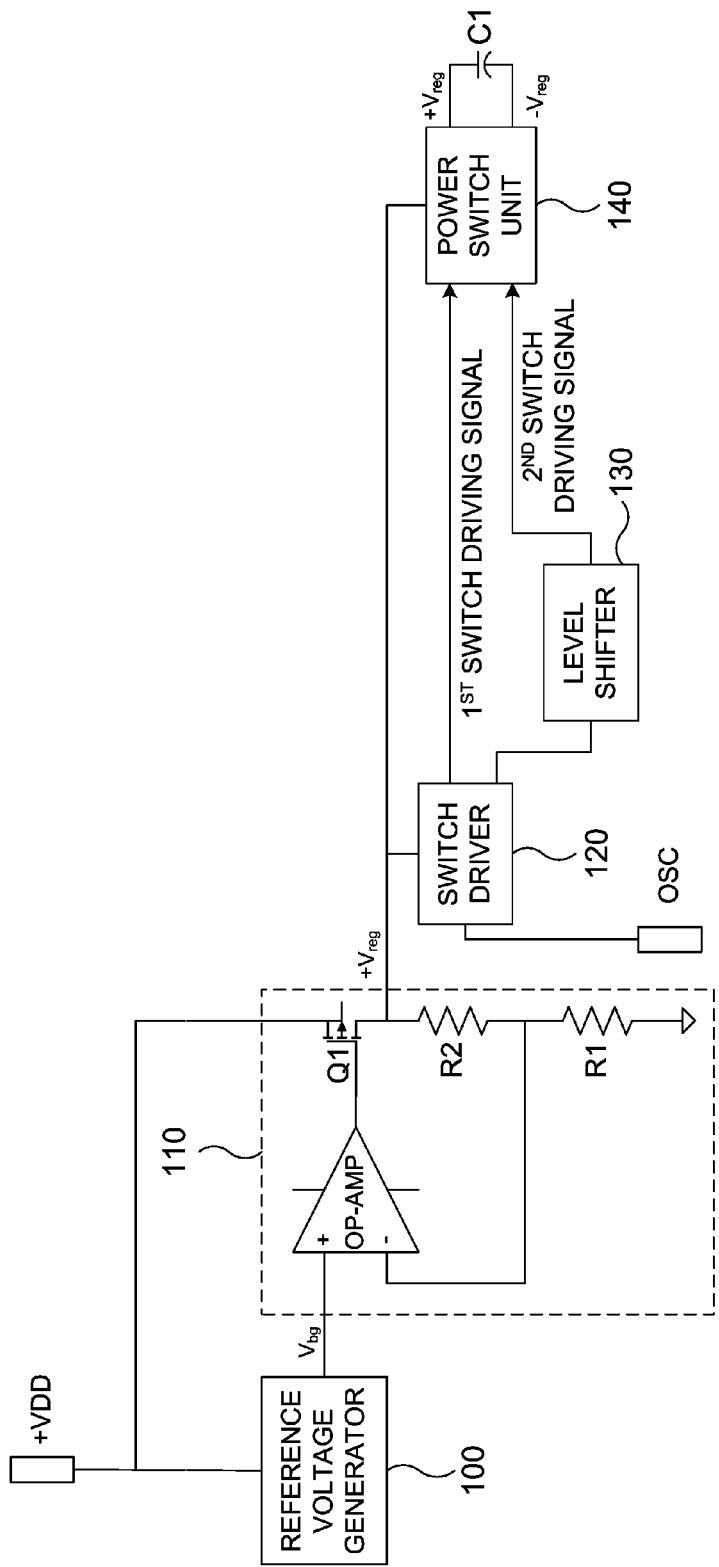
FIG. 1 is a diagram exemplifying a power supply circuit in accordance with the present invention.

FIG. 1 is a diagram exemplifying a power supply circuit in accordance with the present invention.

Referring to FIG. 1, the power supply circuit comprises a reference voltage generator 100, a voltage regulator 110, a switch driver 120, a level shifter 130 and a power switch unit 140.

The reference voltage generator 100 generates a reference voltage Vbg from an output voltage +VDD outputted from a voltage source. A constant voltage +Vreg is generated based on the reference voltage Vbg.

The voltage regulator 110 generates the constant voltage +Vreg from the reference voltage Vbg.

The voltage regulator 110 comprises an operational amplifier, a first resistor R1, a second resistor R2 and a transistor Q1.

The reference voltage Vbg is applied to a non-inverting terminal of the operational amplifier.

The reference voltage Vbg is applied to the first resistor R1 connected between an inverting terminal of the operational amplifier and a ground, and a current I (=Vbg/R1) flows through the first resistor R1. Therefore, the current I also flows through the second resistor R2 connected between the first resistor R1 and an output terminal of the voltage regulator 110. Therefore, the voltage regulator 110 outputs the constant voltage +Vreg (=R2/R1*Vbg+Vbg).

The transistor Q1 is connected to the voltage source, an output terminal of the operational amplifier and the second resistor R2, and the transistor Q1 and the second resistor R2 form a negative feedback loop. Because of the transistor Q1, the voltage regulator 110 generates the constant voltage +Vreg which is stable and robust to a power supply noise, and provides sufficient currents to the switch driver 120 and the power switch unit 140.

The switch driver 120 converts an output signal of an oscillator OSC into a signal having a level suitable for driving a power switch included in the power switch unit 140, namely, a first switch driving signal.

The switch driver 120 uses the constant voltage +Vreg generated by the voltage regulator 110 as a power supply.

When the switch driver 120 uses the constant voltage +Vreg as the power supply, the first switch driving signal has a voltage of zero or the constant voltage +Vreg.

The level shifter 130 generates a second switch driving signal from the first switch driving signal generated by the switch driver 120. The second switch driving signal has a voltage of a constant voltage −Vreg or the constant voltage +Vreg.

The level shifter 130 uses a first output signal and a second output signal outputted by the power switch unit 140 as a power supply.

The power switch unit 140 uses the constant voltage +Vreg generated by the voltage regulator 110 as a power supply, and is driven by the first switch driving signal and the second switch driving signal. The power switch unit 140 outputs the first output signal and the second output signal via an anode and a cathode of a first capacitor C1, respectively.

Preferably, the first output signal and the second output signal has opposite polarities and each of the first output signal and the second output signal have an absolute value of |Vreg|. That is, the first output signal and the second output signal is the constant voltage +Vreg and the constant voltage −Vreg, respectively.

The second output signal is used to provide a negative power supply to an amplifier included in a headphone driver.

An operation of the power supply circuit in accordance with the present invention is described below in more detail.

When the output voltage +VDD outputted from a voltage source is applied, the reference voltage generator 100 generates the reference voltage Vbg, and the voltage regulator 110 generates the constant voltage +Vreg from the reference voltage Vbg.

The switch driver 120 and the power switch unit 140 operate using the constant voltage +Vreg as the power supply.

When the output signal of an oscillator OSC is high, the switch driver 120 drives the power switch unit 140 to apply the constant voltage +Vreg and zero to the anode and the cathode of the first capacitor C1, respectively.

When the output signal of an oscillator OSC is low, the switch driver 120 drives the power switch unit 140 to draw the voltage of anode of the first capacitor C1 down to zero. The first capacitor C1 has a characteristic that maintains a voltage difference between the anode and cathode. Therefore, the voltage of the cathode of the first capacitor C1 is the constant voltage −Vreg.

The level shifter 130 uses the constant voltage +Vreg and the constant voltage −Vreg, which is the voltage of the anode and the cathode of the first capacitor C1, as a power supply, to convert the first switch driving signal that swings between zero and +Vreg into the second switch driving signal that swings between −Vreg and +Vreg.

The power switch in the power switch unit 140 is driven using the first switch driving signal that swings between zero and the constant voltage +Vreg to provide the negative power supply by drawing the voltage of the cathode of the first capacitor C1 down to the constant voltage +Vreg. In order to generate the constant voltage −Vreg for the negative power supply more stably and accurately, the power switch in the power switch unit 140 is driven using the second switch driving signal that swings between −Vreg and +Vreg, to draw the voltage of the cathode of the first capacitor C1 down to the constant voltage +Vreg.

The voltage of the cathode of the first capacitor obtained by above-described operation is used as the negative power supply of the amplifier included in the headphone driver and the constant voltage +Vreg is used as the positive power supply of the headphone driver.

Figure 2:
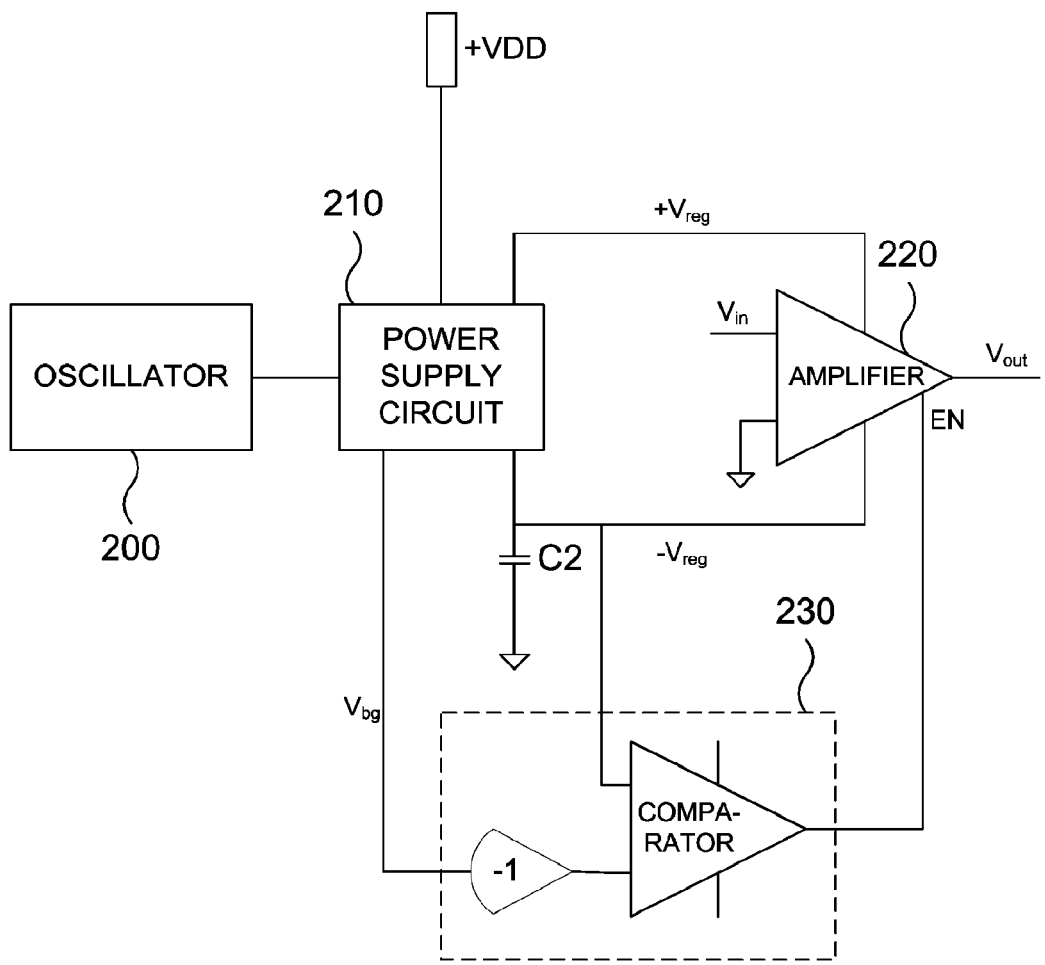
FIG. 2 is a diagram exemplifying a headphone driving circuit employing a power supply circuit in accordance with the present invention.

FIG. 2 is a diagram exemplifying a headphone driving circuit employing a power supply circuit in accordance with the present invention.

Referring to FIG. 2, the headphone driving circuit in accordance with the present invention comprises an oscillator 200, a power supply circuit 210 and an amplifier 220. Moreover, the headphone driving circuit in accordance with the present invention further comprises a second capacitor C2 and an amplifier controller 230.

The oscillator 200 provides a clock signal to the power supply circuit 210. The power supply circuit 210 converts the clock signal to drive a power switch included in the power supply circuit 210.

The power supply circuit 210 provides a positive power supply and a negative power supply to the amplifier 220. A description of the power supply circuit 210 is given above in detail with reference to FIG. 1. Therefore, the detailed description is omitted.

The amplifier 220 is provided with the positive power supply and the negative power supply from the power supply circuit 210, and generates an output signal Vout driving a headphone by amplifying an audio signal Vin.

Specifically, the amplifier 220 is provided with the constant voltage +Vreg as the positive power supply and the constant voltage −Vreg as the negative power supply from a voltage regulator 110 and a power switch unit 140 included in the power supply circuit 210, respectively.

The second capacitor C2 is connected between a cathode of a first capacitor C1 and a ground. That is, the second capacitor C2 is connected between a negative power supply input terminal of the amplifier 220 and a ground. The second capacitor C2 enables the power supply circuit 210 to provide more stable negative power supply.

The amplifier controller 230 enables or disables the amplifier 220. The amplifier controller 230 comprises a comparator comparing an inverting signal of a reference voltage Vbg and the constant voltage −Vreg, and the comparator generates an enabling signal enabling the amplifier 220. The amplifier controller 230 enables the amplifier 220 only when the constant voltage −Vreg, which is the negative power supply provided to the amplifier, is stably provided to amplifier 220.

The power supply circuit including the voltage regulator and the headphone driving circuit employing the same in accordance with the present invention have following advantages.

The power supply circuit in accordance with the present invention may provide stable power supply to the amplifier since the power supply circuit generates the constant voltage +Vreg and the constant voltage −Vreg from +VDD robust to stronger than a power noise.

In addition, since it is not necessary to apply to the amplifier, the balanced signal path for isolating the noise of the input signal to be amplified is not required to simplify the constitution of the circuit.

While the present invention has been particularly shown and described with reference to the preferred embodiment thereof, it will be understood by those skilled in the art that various changes in form and details may be effected therein without departing from the spirit and scope of the invention as defined by the appended claims.

What is claimed is:

1. A power supply circuit comprising:
   a reference voltage generator for generating a reference voltage from an output voltage outputted from a voltage source;
   a voltage regulator for generating a constant voltage +Vreg from the reference voltage;
   a switch driver for converting an output signal of an oscillator into a first switch driving signal using the constant voltage +Vreg generated by the voltage regulator as a power supply;
   a level shifter for generating a second switch driving signal from the first switch driving signal generated by the switch driver; and
   a power switch unit for being driven by the first switch driving signal and the second driving signal to output a first output signal and a second output signal via an anode and a cathode of a first capacitor, respectively, using the constant voltage +Vreg generated by the voltage regulator as a power supply.

2. The circuit in accordance with claim 1, wherein the first switch driving signal has a voltage of between zero and the constant voltage +Vreg.

3. The circuit in accordance with claim 1, wherein the second switch driving signal has a voltage of between a constant voltage −Vreg and the constant voltage +Vreg.

4. The circuit in accordance with claim 1, wherein the first output signal and the second output signal have opposite polarities and each of the first output signal and the second output signal has an absolute value of |Vreg|.

5. The circuit in accordance with claim 1, wherein the level shifter uses the first output signal and the second output signal as a power supply.

6. The circuit in accordance with claim 1, wherein the voltage regulator comprises:
   an operational amplifier having the reference voltage applied to a non-inverting terminal thereof;
   a first resistor connected between a ground and an inverting terminal of the operational amplifier;
   a second resistor connected between the first resistor and an output terminal of the voltage regulator; and
   a transistor connected to an output terminal of the voltage source, an output terminal of the operational amplifier and the second resistor.

7. A headphone driver comprising:
   a power supply circuit comprising: a reference voltage generator for generating a reference voltage from an output voltage outputted from a voltage source; a voltage regulator for generating a constant voltage +Vreg from the reference voltage; a switch driver for converting an output signal of an oscillator into a first switch driving signal using the constant voltage +Vreg generated by the voltage regulator as a power supply; a level shifter for generating a second switch driving signal from the first switch driving signal generated by the switch driver; and a power switch unit for being driven by the first switch driving signal and the second driving signal to output respectively a first output signal and a second output signal via an anode and a cathode of the first capacitor, respectively, using the constant voltage +Vreg generated by the voltage regulator as a power; and
   an amplifier being provided with a positive power supply and a negative power supply from the voltage regulator and the power switch unit, respectively, to drive a headphone by amplifying an audio signal.

8. The headphone driver in accordance with claim 7, wherein the first switch driving signal has a voltage of between zero and the constant voltage +Vreg.

9. The headphone driver in accordance with claim 7, wherein the second switch driving signal has a voltage of between a constant voltage −Vreg and the constant voltage +Vreg.

10. The headphone driver in accordance with claim 7, wherein the first output signal and the second output signal have opposite polarities and each of the first output signal and the second output signal has an absolute value of |Vreg|.

11. The headphone driver in accordance with claim 7, wherein the level shifter uses the first output signal and the second output signal as a power supply.

12. The headphone driver in accordance with claim 7, wherein the voltage regulator comprises:
   an operational amplifier having the reference voltage applied to a non-inverting terminal thereof;
   a first resistor connected between a ground and an inverting terminal of the operational amplifier;
   a second resistor connected between the first resistor and an output terminal of the voltage regulator; and
   a transistor connected to an output terminal of the voltage source, an output terminal of the operational amplifier and the second resistor.

13. The headphone driver in accordance with claim 7, wherein the headphone driver further comprises a second capacitor connected between the cathode of the first capacitor and the ground.

14. The headphone driver in accordance with claim 7, wherein the headphone driver further comprises an amplifier controller for enabling and disabling the amplifier according to the constant voltage −Vreg.

* * * * *